(12) United States Patent
Farmer

(10) Patent No.: US 7,545,195 B2
(45) Date of Patent: Jun. 9, 2009

(54) VARIABLE DELAY ELEMENT

(75) Inventor: Michael Martin Farmer, Fort Collins, CO (US)

(73) Assignee: Avago Technologies Enterprise IP (Singapore) Pte. Ltd., Singapore (SG)

(*) Notice: Subject to any disclaimer, the term of this patent is extended or adjusted under 35 U.S.C. 154(b) by 197 days.

(21) Appl. No.: 11/599,237

(22) Filed: Nov. 14, 2006

(65) Prior Publication Data

US 2008/0111608 A1     May 15, 2008

(51) Int. Cl.
*H03H 11/26*     (2006.01)
(52) U.S. Cl. .................................. 327/277; 327/284
(58) Field of Classification Search ......... 327/276–278, 327/283–285, 290, 393–395
See application file for complete search history.

(56) References Cited

U.S. PATENT DOCUMENTS

| | | | | | |
|---|---|---|---|---|---|
| 5,121,014 | A | * | 6/1992 | Huang ........................ | 327/276 |
| 5,506,534 | A | * | 4/1996 | Guo et al. .................... | 327/276 |
| 6,052,003 | A | * | 4/2000 | Molin et al. ................. | 327/112 |
| 6,414,557 | B1 | * | 7/2002 | Liu ............................. | 331/57 |
| 6,911,857 | B1 | * | 6/2005 | Stiff ........................... | 327/281 |

* cited by examiner

*Primary Examiner*—Lincoln Donovan
*Assistant Examiner*—Hai L. Nguyen

(57) ABSTRACT

A variable delay element includes first and second input stages, each input stage comprising a charge pumping circuit and a discharging circuit, each charge pumping circuit and each discharging circuit associated with the first and second input stages configured to operate on opposite phases of an input signal, and an output stage comprising at least two transistors. The transistors are independently controlled by the first and second input stages and produce an output signal which is a delayed version of the input signal.

13 Claims, 5 Drawing Sheets

VARIABLE DELAY ELEMENT

BACKGROUND

A delay element is used in many electronic circuits to delay one or more signals. In a typical implementation one or more delay elements are arranged serially in what is referred to as a delay line to serially delay a signal. A typical clock signal is provided as a signal that varies over a 360 degree phase. Typical delay lines can delay the output phase of a clock signal by any amount within the 360 degree phase over a band of different frequencies. One typical implementation of a delay line, or a delay lock loop, for use in a phase detector employs an exclusive OR (XOR) logic element. Unfortunately, when implementing a delay locked loop phase detector using an XOR element, allowing the output phase of a clock signal to be delayed more than 180 degrees allows such a phase detector to lock into multiple and possibly non-optimal modes. Implementing a single delay element may be able to compensate for this deficiency. However, a conventional delay element can only delay an input clock signal from the minimum intrinsic gate delay value to a maximum delay of 90 degrees. Further, a conventional delay element attenuates the input signal as the delay is increased and typically requires that the output signal be amplified to a useful level. This attenuation effect limits the lower bandwidth of the circuit.

Therefore, it would be desirable to have a variable delay element that overcomes these shortcomings.

SUMMARY

In an embodiment, a variable delay element comprises first and second input stages, each input stage comprising a charge pumping circuit and a discharging circuit, each charge pumping circuit and each discharging circuit associated with the first and second input stages configured to operate on opposite phases of an input signal, and an output stage comprising at least two transistors which are independently controlled by the first and second input stages producing an output signal which is a delayed version of the input signal. Other systems and methods will also be described.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Embodiments of the variable delay element to be described below will be described in the context of a voltage controlled variable delay element. However, the delay provided by the variable delay element can be controlled using signals other than a voltage signal.

More than one variable delay element can be implemented to form a variable delay line. All such implementations are within the scope of this disclosure.

Figure 1:
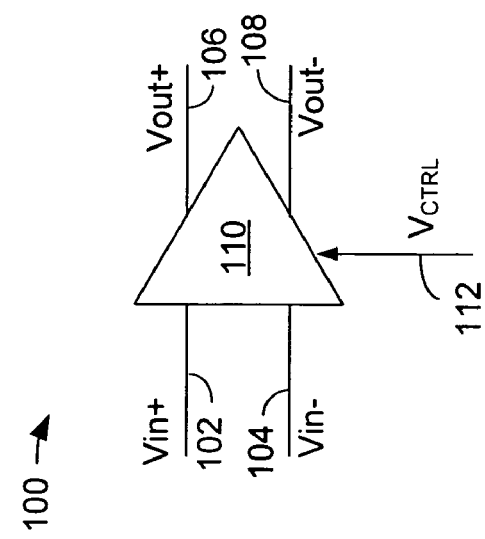
FIG. 1 is a block diagram illustrating an embodiment of a variable delay element.

FIG. 1 is a block diagram illustrating an embodiment of a variable delay element 100 illustrated as a buffer. The variable delay element 100 includes a buffer 110 having differential inputs 102 and 104 and differential outputs 106 and 108. The buffer 110 has a control input via connection 112. The buffer 110 receives a control signal, $V_{CTRL}$, via connection 112. In an embodiment, the control signal is a voltage signal, but it may be another type of signal, such as a control current signal. The level of the control signal, $V_{CTRL}$, determines the amount of delay provided by the variable delay element 100.

Figure 2:
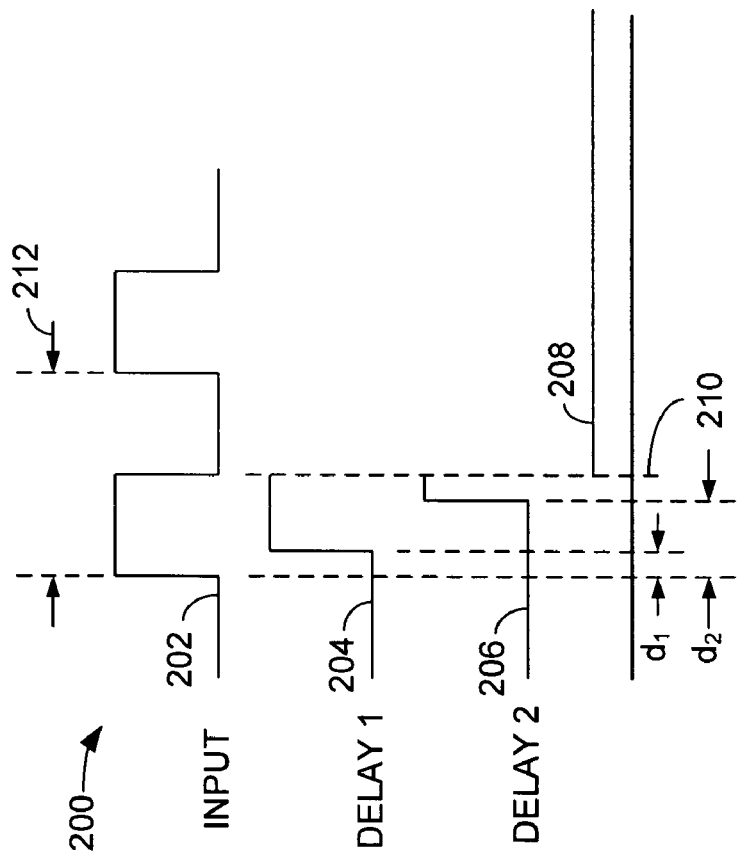
FIG. 2 is a timing diagram illustrating the operation of an embodiment of the variable delay element of FIG. 1.

FIG. 2 is a timing diagram 200 illustrating the operation of an embodiment of the variable delay element 100 of FIG. 1. The timing diagram includes an input signal 202, illustrated as a square wave signal. The input signal is typically a clock signal that is part of an integrated circuit. A full 360° cycle of the input signal 202 is illustrated at 212. However, any input signal can be delayed using the variable delay element 100. In an embodiment, the variable delay element 100 can delay an input signal by an amount between zero delay and 180° delay. The trace 204 illustrates a first delay that is indicated as delay, $d_1$. The trace 206 illustrates a second delay that is indicated as delay, $d_2$. The trace 208 illustrates that the variable delay element 100 ceases delaying the input signal 202 at point 210 and provides no delay after the delay reaches 180 degrees. The delays $d_1$ and $d_2$ are used for illustration purposes only. Any amount of delay between zero delay and 180° can be provided by the variable delay element 100. As will be described below, at the point of 180° phase of the input signal, which is shown as point 210, the variable delay element ceases providing delay.

Figure 3:
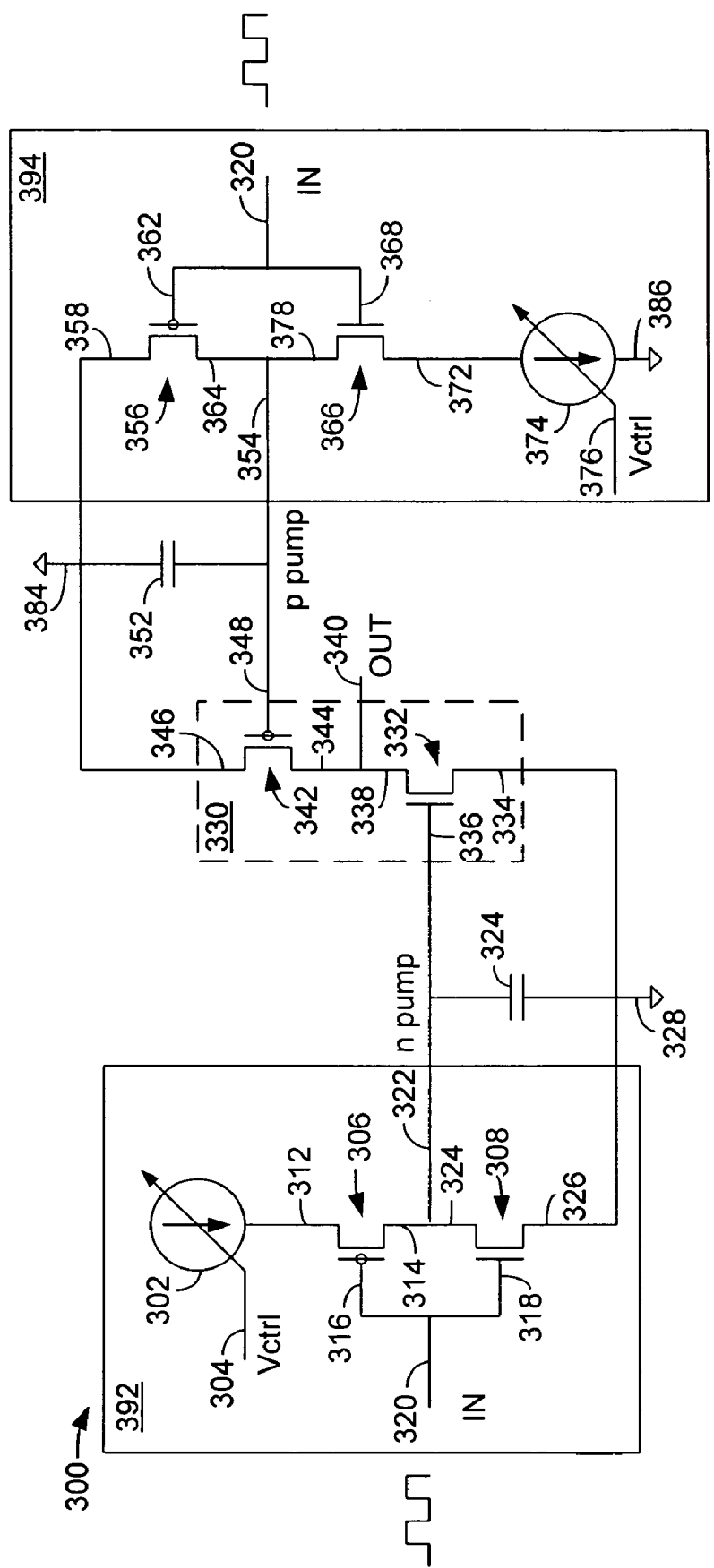
FIG. 3 is a schematic diagram illustrating an embodiment of the variable delay element of FIG. 1.

FIG. 3 is a schematic diagram illustrating an embodiment of one of the differential circuits of the variable delay element 100 of FIG. 1. One of the differential circuits is shown for simplicity. A complete variable delay element includes two instances of the circuit shown in FIG. 3. The variable delay element 300 is constructed using field effect transistor (FET) technology and is implemented using the complementary metal oxide semiconductor (CMOS) manufacturing process. However, the variable delay element 300 can be formed using other switching and semiconductor manufacturing process technology.

The variable delay element 300 comprises an adjustable current source 302 having a variable input 304. The control signal, $V_{CTRL}$, is provided to the adjustable current source 302 via the variable input 304. In an embodiment, the control signal, $V_{CTRL}$, is a variable level signal that varies between 0 and 3.5 volts. The output of the adjustable current source 302 is provided to transistors 306 and 308. The output of the adjustable current source 302 is supplied to the source terminal 312 of the transistor 306. The gate terminal 316 of the transistor 306 and the gate terminal 318 of the transistor 308 are coupled to an input signal on connection 320. The input signal on connection 320 can be, for example, the input clock signal described in FIG. 2. The drain terminal 314 of the transistor 306 is coupled to the drain terminal 324 of the transistor 308. The source terminal 326 of the transistor 308 is coupled to common terminal 328. A capacitance 324 is coupled between connection 322 and the common terminal 328.

The connection 322 between the drain terminal 314 of the transistor 306 and the drain terminal 324 of the transistor 308 is coupled to the gate terminal 336 of the transistor 332. The transistors 332 and 342 form an inverter 330. The source terminal 334 of the transistor 332 is coupled to common terminal 328. The drain terminal 344 of the transistor 342 is coupled to the drain terminal 338 of the transistor 332. The connection 340 between the drain terminal 344 of the transistor 342 and the drain terminal 338 of the transistor 332 forms the output of the variable delay element 300.

The source terminal 346 of the transistor 342 is coupled to supply terminal 384. The gate terminal 348 of the transistor 342 is coupled between the drain terminal 364 of the transistor 356 and the drain terminal 378 of the transistor 366. A capacitance 352 is connected between the connection 348 and the supply terminal 384. The source terminal 358 of the transistor 356 is coupled to the supply terminal 384.

The gate terminal 362 of the transistor 356 and the gate terminal 368 of the transistor 366 are coupled to an input signal on connection 382. The input signal on connection 382 is the same input signal provided on connection 320.

An adjustable current source 374 having a variable input 376 is coupled to the source terminal 372 of the transistor 366. The control signal, $V_{CTRL}$, is provided to the adjustable current source 374 via the variable input 376. In an embodiment, the control signal, $V_{CTRL}$, is a variable level signal that varies between 0 and 3.5 volts. The adjustable current source 374 is coupled to the common terminal 386.

For purposes of the description to follow, the signal on connection 322 will also be referred to as "n pump" and the signal on connection 348 will also be referred to as "p pump."

Figure 4:
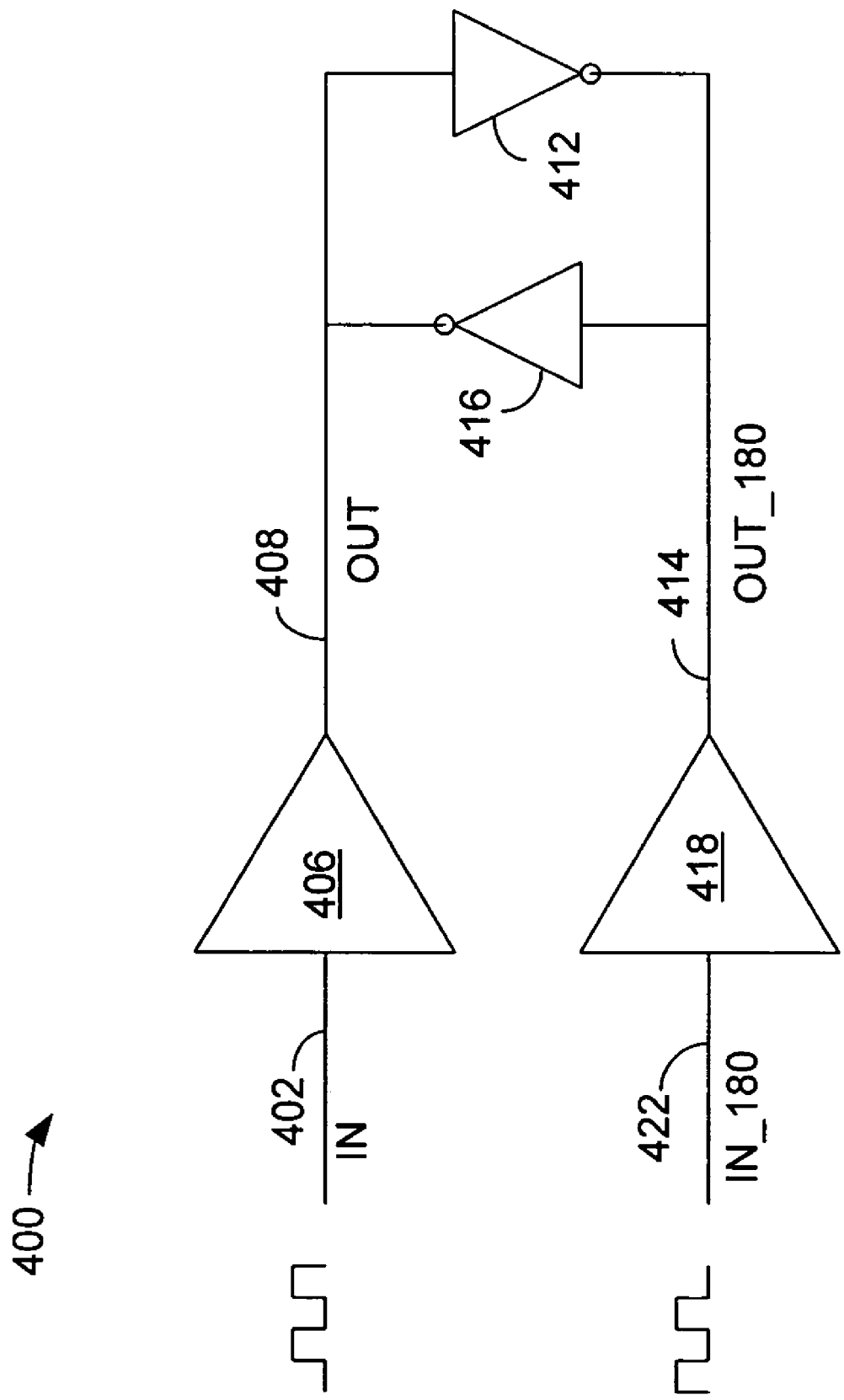
FIG. 4 is a schematic diagram illustrating two instances of the variable delay element of FIG. 3.

FIG. 4 is a schematic diagram illustrating two instances of the variable delay element 300 of FIG. 3. The variable delay element 400 constitutes a variable delay element that operates on both phases of an input signal. The variable delay element 400 comprises a circuit portion 406 and a circuit portion 418. The circuit portion 406 corresponds to the variable delay element 300 described above. The circuit portion 418 operates on the opposite phase of the input signal than the portion 406. A first phase of the input signal is supplied on connection 402 and an opposite phase of the input signal is supplied on connection 422. The input signal on connection 402 is delayed by the circuit portion 406, as described above, and the output is provided on connection 408. The connection 408 corresponds to the connection 340 in FIG. 3.

The output signal on connection 408 is provided to an inverter 412. The output of the inverter 412 is a signal that is opposite in phase from the signal on connection 408. The opposite phase input signal on connection 422 is delayed by the circuit portion 418, as described above, and the output is provided on connection 414. The output signal on connection 414 is provided to an inverter 416. The output of the inverter 416 is a signal that is opposite in phase from the signal on connection 414.

The two inverters 412 and 416 across outputs of circuit portions 406 and 418 improve the duty cycle of the variable delay element 400 by operating the circuit portions 406 and 418 on opposite phases of the input clock signal. This arrangement causes rise and fall time behavior to be effectively averaged creating an output with a duty cycle characteristic that closely approximates the duty cycle of the input clock signal.

Figure 5:
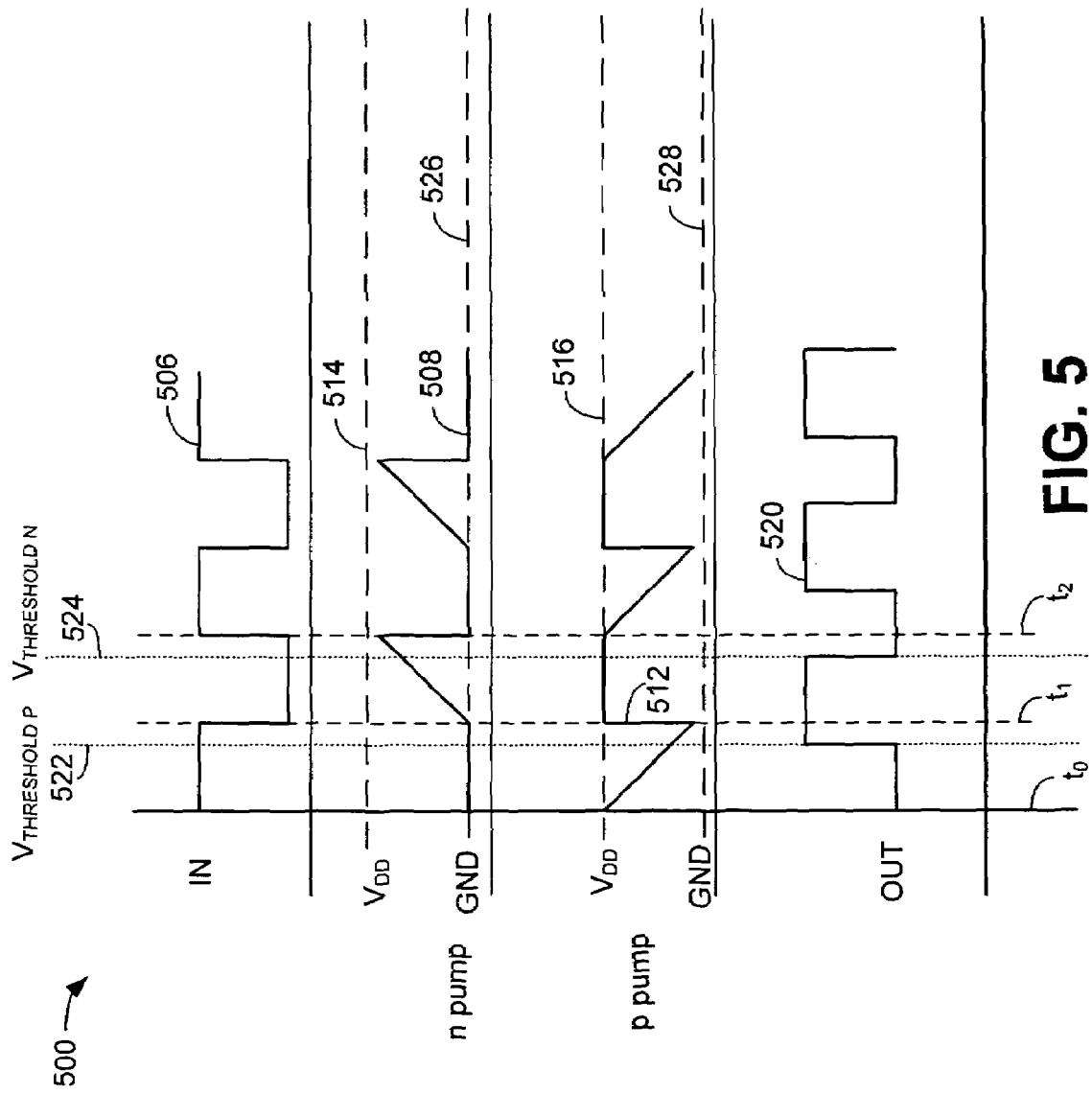
FIG. 5 is a timing diagram illustrating the operation of the embodiment of the variable delay element of FIG. 3.

FIG. 5 is a timing diagram 500 illustrating the operation of the embodiment of the variable delay element of FIG. 3. The input signal is shown using the trace 506, the signal on connection 322 (n pump) is shown using trace 508 and the signal on connection 348 (p pump) is shown using trace 512. The supply voltage, $V_{DD}$ is shown using traces 514 and 516. System ground is shown using traces 526 and 528. The output signal on connection 340 is shown using trace 520. At the time, $t_0$, the input signal transitions from a logic low to a logic high. It should be mentioned that the transition from logic low to logic high is arbitrary and the operation of the variable delay element is similar on either a logic low to logic high transition or on a logic high to logic low transition.

At time $t_0$, the signal on connection 322 (trace 508) remains unchanged and the signal on connection 348 (trace 512) begins to fall from $V_{DD}$ to a minimum value determined by the adjustable current source 374 and the size of the capacitance 352 on node 354 at the time $t_1$. During the time after $t_0$ and prior to $t_1$, the observed output 340 (trace 520) remains low until the threshold voltage ($V_{THRESHOLD\ P}$) of the transistor 342 is exceeded. When the threshold voltage ($V_{THRESHOLD\ P}$) of the transistor 342 is exceeded, the transistor 342 causes a low to high transition to be quickly made at the output node 340. At time $t_1$, the input signal 506 transitions from logic high to logic low. At time $t_1$, the signal on connection 348 (trace 512) is quickly pulled to $V_{DD}$ where it remains unchanged until the next input transition. At this time the signal on connection 322 (trace 508) begins to rise from a ground level to the maximum level. During the time after $t_1$ and prior to $t_2$, the observed output 340 (trace 520) remains high until the threshold voltage ($V_{THRESHOLD\ N}$) of the transistor 332 is exceeded. When the threshold voltage ($V_{THRESHOLD\ N}$) of the transistor 332 is exceeded, the transistor 332 causes a high to low transition to be quickly made at the output node 340. At time $t_2$, which time is equal to 360° of the input signal 506, the node 322 (trace 508) is quickly pulled low and the process repeats from time $t_0$.

The transistors 306 and 308 and the adjustable current source 302 form a first input stage 392 that operates on one phase of the input signal. The transistor 306 acts as a charge pump circuit and the transistor 308 acts as a discharging circuit. The transistors 356 and 366 and the adjustable current source 374 form a second input stage 394 that operates on the opposite phase of the input signal. The transistor 366 acts as a charge pump circuit and the transistor 356 acts as a discharging circuit. The transistors 332 and 342 form an inverter 330 in which the transistors 332 and 342 are independently controlled by the first input stage 392 and the second input stage 394, respectively, thus producing an output signal which is a delayed version of the input signal. The transistors 332 and 342 in the output stage alternately pull the output 340 to a logic high value and a logic low value.

A wide bandwidth is achieved because the output of the transistors 342 and 332 swings between the level of the supply voltage ($V_{DD}$) and ground regardless of the delay. The output will always be full swing, regardless of delay, until a delay of 180 degrees is reached, in which case no switching will occur. A conventional delay line produces an increasingly smaller swing as delay is increased. Thus, at low frequencies the output signal of a conventional delay line is not capable of driving a circuit that requires full swing drive such as standard CMOS logic. Further, because the output is typically amplified some degree of signal corruption to accommodate standard CMOS logic is encountered using a conventional delay line.

With reference to FIG. 3 and FIG. 5, the transistor 306 forms a current pumping circuit and the transistor 308 forms a current dumping circuit in which the transistor 308 is sized to quickly pull up the node 322 when switched on. Similarly, the transistor 366 forms a current pumping circuit and the transistor 356 forms a current dumping circuit in which the transistor 366 is sized to quickly pull up the node 348 when switched on. In this manner, the variable delay element 300 will quickly transition the output 340 from $V_{DD}$ to ground without attenuating the output signal as the delay increases from zero delay to a delay of 180°. The control voltage, $V_{CTRL}$, controls the length of the delay by increasing or decreasing the amount of current supplied by the adjustable current sources 302 and 374. This current charges the capacitances 324 and 352 at a rate determined by the current supplied by the adjustable current sources 302 and 374. Increasing the current supplied by the adjustable current sources 302 and 374 decreases the time required to charge the pump nodes 322 and 348 and decreases the time required for the transistors 342 and 332 to reach their respective threshold voltages, $V_{THRESHOLD\_P}$ and $V_{THRESHOLD\_N}$. Therefore, more current supplied by the adjustable current sources 302 and 374 corresponds to a shorter delay. The pump node capacitances 352 and 324 are charged in a controlled manner on alternating phases of the input signal on connection 320. The pump nodes 348 and 322 are discharged quickly on the opposite phase of the input signal via transistors 308 and 356. These transistors should be sized in a manner to maximize discharge time relative to charge time. The result is shown in FIG. 5 using traces 508 and 512 and appears as a voltage ramp followed by a quick edge during the discharge cycle.

The two inverters 412 and 416 across outputs of circuit portions 406 and 418 improve the duty cycle of the variable delay element 400 by operating the circuit portions 406 and 418 on opposite phases of the input clock signal. This arrangement causes rise and fall time behavior to be effectively averaged creating an output with a duty cycle characteristic that closely approximates the duty cycle of the input clock signal.

Figure 6:
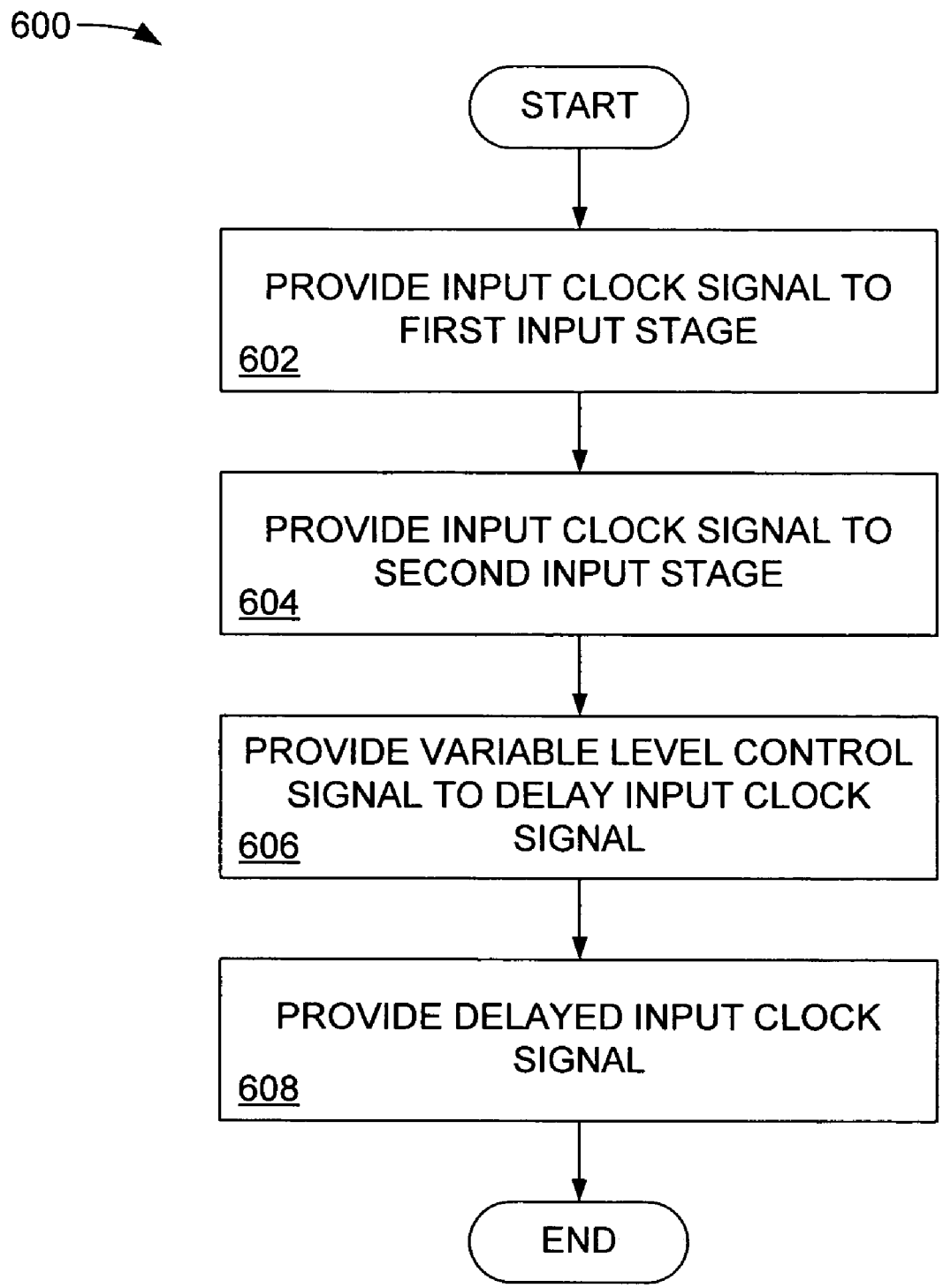
FIG. 6 is a flowchart showing the operation of an embodiment of the variable delay element of FIG. 3.

FIG. 6 is a flowchart showing the operation of an embodiment of the variable delay element 300 of FIG. 3. In block 602, an input signal is provided to a first stage of the variable delay element 300. In block 604, the input signal is provided to a second stage of the variable delay element 300. The first input stage and the second input stage operate on opposite phases of the input signal. In block 606, a variable level control signal, $V_{CTRL}$ is provided to the variable delay element 300. In block 608, the variable delay element 300 delays the input signal by an amount between zero delay and a delay of 180°. The delay is determined by the level of the variable level control signal.

This disclosure describes the invention in detail using illustrative embodiments. However, it is to be understood that the invention defined by the appended claims is not limited to the precise embodiments described.

What is claimed is:

1. A variable delay element, comprising:
a first input stage circuit and a second input stage circuit not operably connected directly to one another, the first and second input stage circuits each comprising respective charge pumping and discharging circuits and being configured to receive the same input signal as inputs thereto, the first input stage circuit further comprising a variable current source controlled by a first variable control voltage provided thereto, the second input stage circuit further comprising a variable current sink controlled by a second variable control voltage provided thereto, the first and second input stage circuits providing first and second outputs therefrom, respectively, and
a third output stage circuit comprising at least first and second transistors having inputs operable connected, respectively, to the first and second outputs, the third output stage circuit providing a third output signal that is a delayed version of the input signal;
wherein the first variable control voltage is different from the second variable control voltage, variation of the first and second variable control voltages causes a variable delay between the input and third output signals, and the third output signal provided by the third output stage circuit is capable of swinging between a supply voltage and ground regardless of the amount of the delay.

2. The variable delay element of claim 1, wherein the first and second transistors are FETs.

3. The variable delay element of claim 1, wherein the variable delay element is implemented using a CMOS manufacturing process.

4. The variable delay element of claim 1, wherein the variable delay between the input signal and the third output signal ranges between about a minimal value and about 180 degrees.

5. The variable delay element of claim 1, wherein the input signal is a clock signal.

6. The variable delay element of claim 1, in which the third output stage circuit does not switch when the input and the third output signal are out of phase by about 180 degrees.

7. The variable delay element of claim 1, wherein at least one of the first variable control voltage and the second variable control voltage ranges between about 0 volts and about 3.5 volts.

8. the variable delay element of claim 1, wherein the first and second transistors in the third output stage circuit are configured to alternately pull the third output signal between a logic high value and a logic low value to produce the delayed version of the input signal.

9. A method for variably delaying a signal, the method comprising:
simultaneously providing an input signal having to first and second input stage circuits, the first and second input stage circuits each comprising respective charge pumping and discharging circuits, the first input stage circuit and the second input stage circuit not being operable connected directly to one another, the first input stage circuit further comprising a variable current source controlled by a first variable control voltage provided thereto, the second input stage circuit further comprising a variable current sink controlled by a second variable control voltage provided thereto, the first variable control voltage being different from the second variable control voltage, the first and second input stage circuits providing first and second outputs therefrom, respectively;
providing the first and second outputs to inputs of first and second transistors, respectively, of a third output stage circuit, the third output stage circuit being configured to provide a third output signal that is a delayed version of the input signal, and
varying the first and second variable control voltages to vary an amount of a delay of the input signal as represented by the third output signal.

10. The method of claim 9, further comprising delaying the third output signal in respect of the input signal by an amount between a minimal value and about 180 degrees.

11. The method of claim 9, further comprising providing the input signal as a clock signal.

12. The method of claim 9, further comprising ceasing the delay in the third output signal respecting the input signal when the phase difference therebetween reaches about 180 degrees.

13. The method of claim 9, further comprising varying at least one of the first variable control voltage and the second variable control voltage between about 0 volts and about 3.5 volts.

* * * * *

UNITED STATES PATENT AND TRADEMARK OFFICE
CERTIFICATE OF CORRECTION

PATENT NO. : 7,545,195 B2  
APPLICATION NO. : 11/599237  
DATED : June 9, 2009  
INVENTOR(S) : Michael M. Farmer Page 1 of 1

It is certified that error appears in the above-identified patent and that said Letters Patent is hereby corrected as shown below:

Column 5, Line 62 (Approx.), Claim 1, delete "operable" and insert --operably--.

Column 6, Line 35 (Approx.), Claim 9, delete "operable" and insert --operably--.

Signed and Sealed this  
Twenty-fifth Day of September, 2012

David J. Kappos  
*Director of the United States Patent and Trademark Office*